(12) United States Patent
Chan

(10) Patent No.: US 6,749,974 B2
(45) Date of Patent: Jun. 15, 2004

(54) DISPOSABLE HARD MASK FOR PHOTOMASK PLASMA ETCHING

(75) Inventor: David Y. Chan, Austin, TX (US)

(73) Assignee: Photronics, Inc., Brookfield, CT (US)

(*) Notice: Subject to any disclaimer, the term of this patent is extended or adjusted under 35 U.S.C. 154(b) by 0 days.

(21) Appl. No.: 10/234,790

(22) Filed: Sep. 3, 2002

(65) Prior Publication Data

US 2003/0013023 A1 Jan. 16, 2003

Related U.S. Application Data

(63) Continuation of application No. 09/409,454, filed on Sep. 30, 1999, now Pat. No. 6,472,107.

(51) Int. Cl.[7] ............................. G03F 9/00; G03C 5/00
(52) U.S. Cl. ............................................... 430/5; 430/323
(58) Field of Search .......................... 430/5, 312, 313, 430/323, 316, 317, 318, 396; 378/34, 35; 716/19

(56) References Cited

U.S. PATENT DOCUMENTS

| 4,178,403 A | 12/1979 | Sakurai et al. |
|---|---|---|
| 4,556,608 A | 12/1985 | Kaneki et al. |
| 4,720,442 A | 1/1988 | Shinkai et al. |
| 5,451,543 A | 9/1995 | Woo et al. |
| 5,460,908 A | 10/1995 | Reinberg |
| 5,482,799 A | 1/1996 | Isao et al. |
| 5,578,402 A | 11/1996 | Watanabe |
| 5,693,568 A | 12/1997 | Liu et al. |
| 5,725,973 A | 3/1998 | Han et al. |
| 5,756,396 A | 5/1998 | Lee et al. |
| 5,939,227 A | 8/1999 | Smith |
| 5,955,222 A | 9/1999 | Hibbs et al. |
| 6,472,107 B1 * | 10/2002 | Chan .................. 430/5 |

* cited by examiner

Primary Examiner—Mary R Huff
Assistant Examiner—Saleha R. Mohamedulla
(74) Attorney, Agent, or Firm—Amster, Rothstein & Ebenstein LLP

(57) ABSTRACT

A method for creating a photomask which includes a layer of hard mask material the inclusion of which improves the uniformity of critical dimensions on the photomask by minimizing the affect of macro and micro loading. The method for producing the photomask of the instant invention includes two etching processes. The first etching process etches the layer of hard mask, and the second etching process etches the anti-reflective material and opaque material.

11 Claims, 5 Drawing Sheets

DISPOSABLE HARD MASK FOR PHOTOMASK PLASMA ETCHING

CROSS-REFERENCE TO RELATED APPLICATION

This patent application is a continuation of U.S. application Ser. No. 09/409,454, filed Sep. 30, 1999 now U.S. Pat. No. 6,472,107, and entitled "DISPOSABLE HARD MASK FOR PHOTOMASK PLASMA ETCHING," the contents of which are incorporated herein by reference in their entirety.

BACKGROUND

The present invention relates to a photomask which includes a hard mask layer, the use of which improves the uniformity of critical dimensions on the photomask.

Photomasks are used in the semiconductor industry to transfer micro-scale images defining a semiconductor circuit onto a silicon or gallium arsenide substrate or wafer. A typical binary photomask is comprised of a transparent quartz substrate and chrome (Cr) opaque material that includes an integral layer of chrome oxide (CrO) anti-reflective (AR) material. The pattern of the Cr opaque material and CrO AR material on the quartz substrate is a scaled negative of the image desired to be formed on the semiconductor wafer.

To create an image on a semiconductor wafer, a photomask is interposed between the semiconductor wafer, which includes a layer of photosensitive material, and an energy source commonly referred to as a Stepper. The energy generated by the Stepper passes through the transparent portions of the quartz substrate not covered by the Cr opaque material and the CrO AR material, and causes a reaction in the photosensitive material on the semiconductor wafer. Energy from the Stepper is inhibited from passing through the areas of the photomask in which the Cr opaque material and CrO AR is present. The CrO AR material prevents most, but not all, of the incident energy from being reflected back into the Stepper. If excess energy is reflected back into the Stepper a degraded image will be created in the photosensitive resist material on the semiconductor wafer surface, thereby resulting in a degradation of performance of the semiconductor device.

A finished photomask used in the production of semiconductor devices is formed from a "blank" or "undeveloped" photomask. As shown in FIG. 1, a prior art blank photomask 20 is comprised of four layers. The first layer 2 is a layer of quartz, commonly referred to as the substrate, and is typically approximately one quarter inch thick. Affixed to the quartz substrate 2 is a layer of Cr opaque material 4 which typically is approximately 900 Å to 1000 Å thick. An integral layer of CrO AR material 6 is formed on top of the layer of Cr opaque material 4. The layer of CrO AR material is typically approximately 100 Å thick. A layer of photosensitive resist material 8 resides on top of the CrO AR material 6. The photosensitive resist material 8 is typically a hydrocarbon polymer, the various compositions and thicknesses of which are well known in the art.

The desired pattern of Cr opaque material to be created on the photomask may be defined by an electronic data file loaded into an exposure system which typically scans an electron beam (E-beam) or laser beam in a raster fashion across the blank photomask. One such example of a raster scan exposure system is described in U.S. Pat. No. 3,900,737 to Collier. As the E-beam or laser beam is scanned across the blank photomask, the exposure system directs the E-beam or laser beam at addressable locations on the photomask as defined by the electronic data file. The areas of the photosensitive resist material that are exposed to the E-beam or laser beam become soluble while the unexposed portions remain insoluble. As shown in FIG. 2, after the exposure system has scanned the desired image onto the photosensitive resist material, the soluble photosensitive resist is removed by means well known in the art, and the unexposed, insoluble photosensitive resist material 10 remains adhered to the CrO AR material 6.

As illustrated in FIG. 3, the exposed CrO AR material and the underlying Cr opaque material no longer covered by the photosensitive resist material in the prior art phoromask 22 is removed by a well known etching process, and only the portions of CrO AR material 12 and Cr opaque material 14 residing beneath the remaining photosensitive resist material 10 remain affixed to quartz substrate 2. This initial or base etching may be accomplished by either a wet-etching or dry-etching process both of which are well known in the art. In general, wet-etching process uses a liquid acid solution to erode away the exposed CrO AR material and Cr opaque material. A dry-etching process, also referred to as plasma etching, utilizes electrified gases, typically a mixture of chlorine and oxygen, to remove the exposed chrome oxide AR material and chrome opaque material.

A dry-etching process is conducted in vacuum chamber in which gases, typically chlorine and oxygen are injected. An electrical field is created between an anode and a cathode in the vacuum chamber thereby forming a reactive gas plasma. Positive ions of the reactive gas plasma are accelerated toward the photomask which is oriented such that the surface area of the quartz substrate is perpendicular to the electrical field. The directional ion bombardment enhances the etch rate of the Cr opaque material and CrO AR material in the vertical direction but not in the horizontal direction (i.e., the etching is anisotropic or directional).

The reaction between the reactive gas plasma and the Cr opaque material and CrO AR material is a two step process. First, a reaction between the chlorine gas and exposed CrO AR material and Cr opaque material forms chrome radical species. The oxygen then reacts with the chrome radical species to create a volatile which can "boil off" thereby removing the exposed CrO AR material and the exposed Cr opaque material.

As shown in FIG. 4, after the etching process is completed the photosensitive resist material in the prior art photomask 24 is stripped away by a process well known in the art. The dimensions of the Cr opaque material on the finished photomask 26 are then measured to determine whether or not critical dimensions are within specified tolerances. Critical dimensions may be measured at a number of locations on the finished photomask, summed, and then divided by the number of measurements to obtain a numerical average of the critical dimensions. This obtained average is then compared to a specified target number (i.e., a mean to target comparison) to ensure compliance with predefined critical dimensions specifications. Additionally, it is desired that there is a small variance among the critical dimensions on the substrate. Accordingly, the measured critical dimensions typically must also conform to a specified uniformity requirement. Uniformity is typically defined as a range (maximum minus minimum) or a standard deviation of a population of measurements.

The etch rate of the plasma etching process described above (and hence the uniformity of the critical dimensions) is dependent on the desired pattern to be formed in the Cr opaque material and CrO AR material. In areas of the photomask where a substantial portion of Cr opaque material and CrO AR material are to be removed (i.e., macro loading), the etching process may take longer than in areas of the photomask in which small portions of Cr opaque material and CrO AR material are to be removed. Likewise, there may be differences in etch rate for micro loading conditions in which the etch rate is different between isolated and dense features in the same general area. These differing etch rates make it more difficult for the finished photomask to conform to a specified uniformity requirement. Additionally, the above described etching process can also cause variances in critical dimensions because the photosensitive resist material is not entirely impervious to the plasma gases.

SUMMARY OF INVENTION

Accordingly, it is an object of the present invention to provide a blank photomask which includes a layer of hard mask material thereby enabling the critical dimensions of a finished photomask to be more uniform.

It is a further object of the invention to provide a method for manufacturing a finished photomask having improved uniformity of critical dimensions.

It is still further an object of the present invention to provide a finished photomask having improved uniformity in critical dimensions and improved anti-reflection properties thereby reducing the amount of error introduced by the basic lithography process.

DETAILED DESCRIPTION OF THE INVENTION

Figure 5:
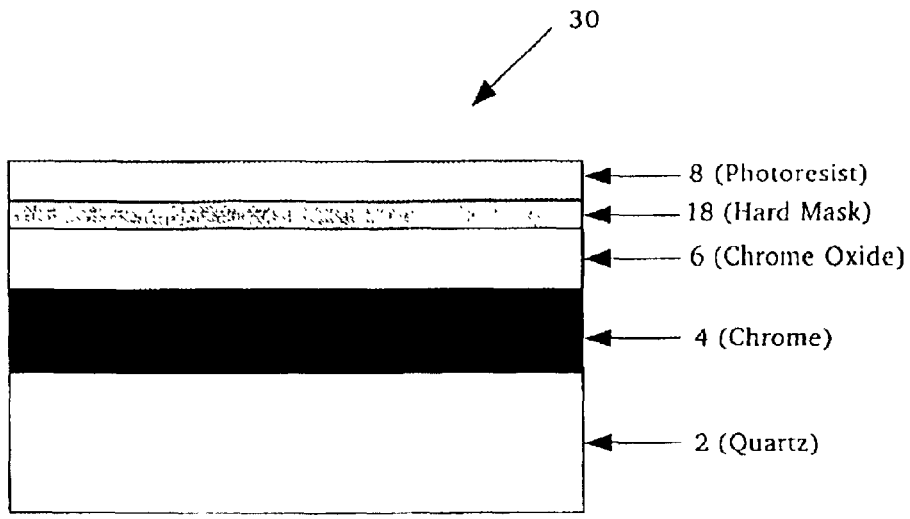
FIG. 5 is a cross-sectional view of a blank photomask is accordance with the instant invention illustrating the composition of the various layers of a typical blank photomask including a hard mask layer.

FIG. 5 depicts a blank photomask in accordance with the present invention. As shown the blank photomask 30 is comprised of a quartz substrate 2 having a thickness of approximately one quarter inch. Affixed to quartz substrate 2 is a layer of Cr opaque material 4 which is typically 900 Å to 1000 Å thick. An integral layer of CrO AR material 6, typically approximately 100 Å thick, is formed on top of the Cr opaque material 4. Hard mask layer 18 is deposited on top of the CrO AR material 6. The hard mask layer 18 may be deposited on the CrO AR layer using a sputtering process or any other method well known in the art such as chemical vapor deposition (CVD). The thickness of the hard mask layer is preferably in the range of 50 to 500 Å, and is most preferably approximately 250 Å thick. In the preferred embodiment, the hard mask layer is comprised of silicon (Si). However, the hard mask layer may also be comprised of other similar materials including but not limited to Ti, TiW, W, TiN, $Si_3N_4$, $SiO_2$, or spin-on-glass.

Figure 6:
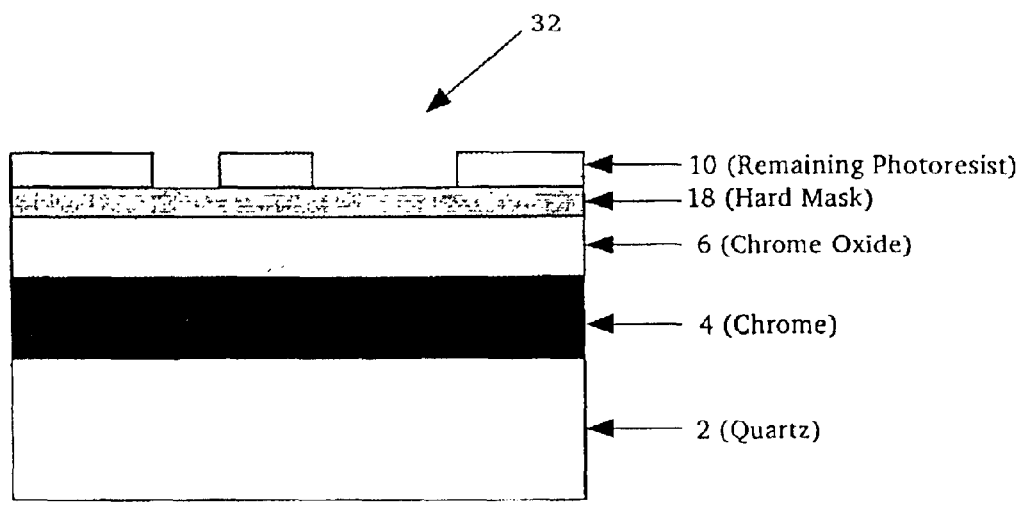
FIG. 6 is a cross-sectional view of a photomask in accordance with the instant invention after exposure to an energy source and having the soluble photosensitive material removed.

The process for creating a finished photomask, having improved critical dimensions and anti-reflective properties, from blank photomask 30 is now described with reference to FIGS. 5 through 9. Initially, the desired pattern to be formed in the hard mask material 18, the CrO AR material 6, and the Cr opaque material 4 is scanned onto the layer of photosensitive resist material 8 of blank photomask 30 by means of a raster scan exposure system, or comparable system (e.g., a vector scan tool). The portions of the photosensitive resist material that are exposed to the E-beam or laser beam become soluble while the unexposed portions remain insoluble. As shown in FIG. 6, after the exposure system has scanned the desired image onto the photosensitive resist material, the soluble photosensitive resist is removed by means well known in the art exposing areas of hard mask material 18, and the unexposed, insoluble photosensitive resist material 10 remains adhered to, and covering, other areas of the hard mask material 18.

Figure 7:
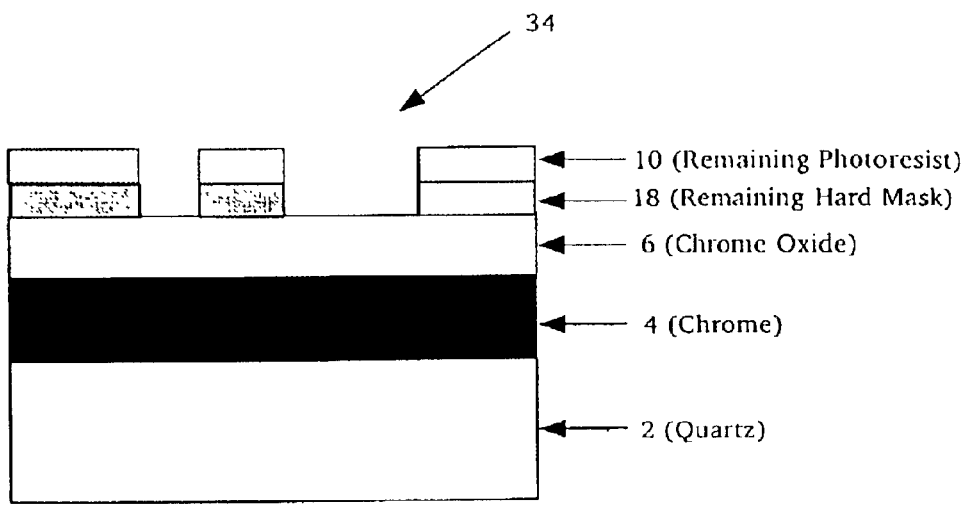
FIG. 7 is a cross-sectional view of a photomask in accordance with the instant invention after being subjected to a first etching process thereby removing the exposed hard mask material.

Photomask 32 of FIG. 6 is next subjected to a first etching process to remove the exposed hard mask material. In the preferred embodiment where the hard mask is comprised of Si, the composition of the plasma gas has either a fluorine, chlorine, or bromine containing species or a combination of various halide containing species such as, but not limited to, $C_2F_6$, $CHF_3$, $Cl_2$, HBr, or $SF_6$. In the preferred embodiment, $Cl_2$ plasma gas is used to etch the Si hard mask. This is advantageous since the same chamber can be used to etch both the hard mask and the Cr and CrO materials without the need for any additional gas hookups. The $C_2F_6$, $CHF_3$, HBr, $Cl_2$, or $SF_6$ plasma gases etch the exposed Si hard mask material in a similar manner as described above with respect to the plasma etching of the Cr and CrO AR material. Silicon halides are volatile and they will be readily removed once formed. However the $C_2F_6$, $CHF_3$, HBr, $Cl_2$, or $SF_6$ plasma gases do not significantly react with the underlying Cr and CrO AR material. Thus, as shown in FIG. 7, only the portions of the exposed hard mask material 18 are removed by the first etching and those portions of the hard mask material underlying the photosensitive resist material 10 are not significantly affected. As shown in FIG. 7, the first etching process exposes those areas of the Cr opaque material and CrO AR material not underlying photosensitive resist material 10 and hard mask material 18.

Photomask 34 of FIG. 7 is next subjected to a second etching process to remove the Cr and CrO layers. The etching process may be conducted with the photosensitive resist material in place, or the photosensitive resist material can be stripped away prior to commencement of the second etching process. As described above, the second etching process is conducted in vacuum chamber in which chlorine and oxygen gases are injected. An electrical field is created between and anode and a cathode in the vacuum chamber thereby forming a reactive gas plasma, and positive ions of the reactive gas plasma are accelerated toward photomask, which is at the same potential as the cathode, and which is oriented such that the surface area of quartz substrate is perpendicular to the electrical field. The reaction between the reactive gas plasma and the Cr opaque material and CrO AR material is a two step process. First, a reaction between the chlorine gas and exposed CrO AR material and Cr opaque material forms chrome radical species. The oxygen then reacts with the chrome radical species to create a volatile which can "boil off" thereby removing the exposed CrO AR material and the exposed Cr opaque material.

It will be appreciated by those skilled in the art that through modification of the chlorine to oxygen ratio, one can retain the hard mask material through the second etch process step. Accordingly, the second etching process can be extended to overcome the effects of macro loading. In other words, the effect of the differing etch rates in areas of photomask 34 having large portions of Cr material and CrO AR material to be removed verses those areas in which only small portions of Cr and CrO AR materials are removed, can be eliminated. Additionally, with prior art photomasks which do not have a hard mask layer, the duration of the etching process is time critical due to the effects of the plasma gases on the photosensitive resist material. That is, as the Cr and CrO is being etched away, the plasma gases are also reacting with the photosensitive material, and if the etching process is continued for too long a period, the photosenstive material may no longer protect the underlying portions of the Cr and CrO AR material from the plasma gases. In short, unlike the etching of prior art photomasks which do not include a layer of hard mask material, the second etching process can be extended in time to ensure that essentially all the exposed Cr and CrO AR materials are removed.

Figure 8:
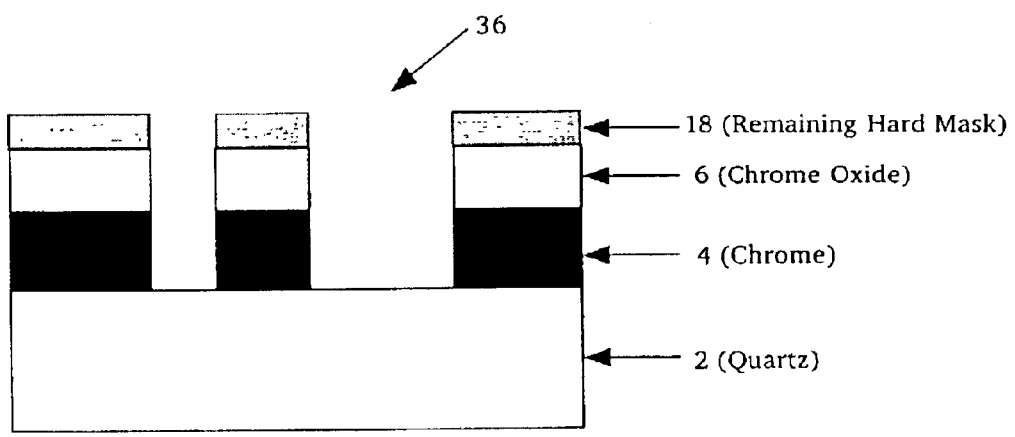
FIG. 8 is a cross-sectional view of a finished photomask in accordance with, the first embodiment of the invention after being subjected to a second etching process thereby removing the exposed CrO AR material and Cr opaque material.

As shown in FIG. 8, the second etching process results in the exposure of only those portions of the quartz substrate 2 which correspond to the pattern originally scanned into the photosensitive material. After completion of the photosensitive material 10 may be stripped away by a process well known in the art, if not already done so prior to the commencement of the second etching process. As shown in FIG. 8, the resulting photomask 36 of a first embodiment of the instant invention having improved uniformity of critical dimensions is comprised of a quartz substrate 2 and patterned layers of Cr opaque material 4, CrO AR material 6, and hard mask material 18. In this first embodiment of the instant invention, hard mask material 18 remains an integral part of the deliverable photomask. This embodiment of the invention is advantageous in that the hard mask material has a de minimis thickness but, depending on its composition, may exhibit excellent anti-reflective characteristics. Hard mask materials of Ti, TiN, TiW, W, and Si exhibit good anti-reflective properties, while hard mask materials of $Si_3N_4$, spin-on-glass, and $SiO_2$ do not exhibit anti-reflective properties.

Figure 9:
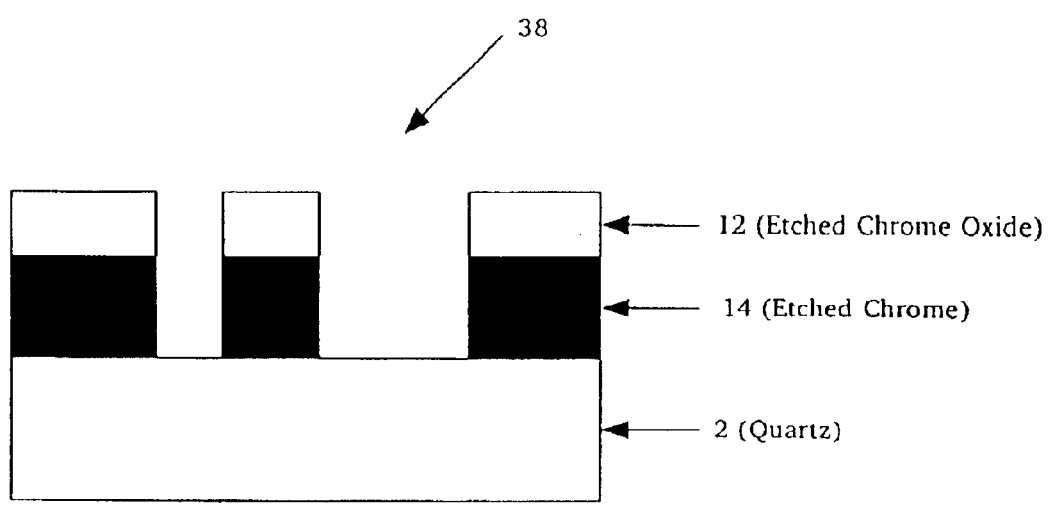
FIG. 9 is cross-sectional view of a second embodiment of a finished photomask is accordance with the present invention.

Alternatively, in a second embodiment of the instant invention shown in FIG. 9, the hard mask 18 can be stripped away using wet or dry etching methods. For example, an aqueous KOH solution can be used to strip away the silicon hard mask.

Figure 1:
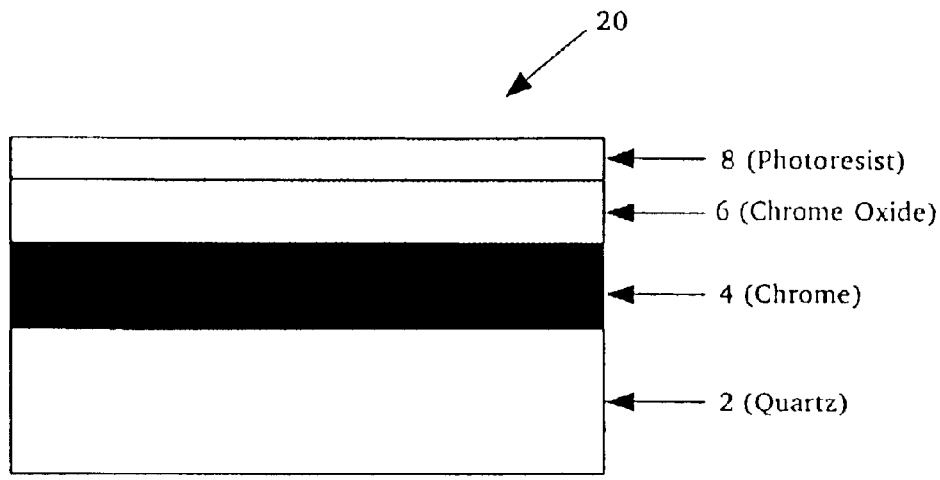
FIG. 1 is a cross-sectional view of a blank photomask illustrating the composition of the various layers of a typical prior art blank binary photomask.
Figure 2:
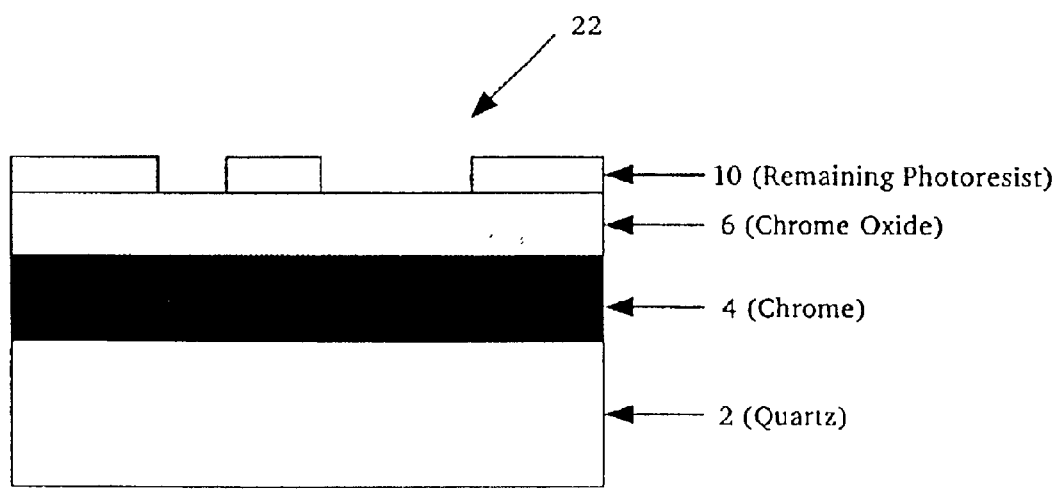
FIG. 2 is a cross-sectional view of a prior art photomask after exposure to an energy source and having the soluble photosensitive material removed.
Figure 3:
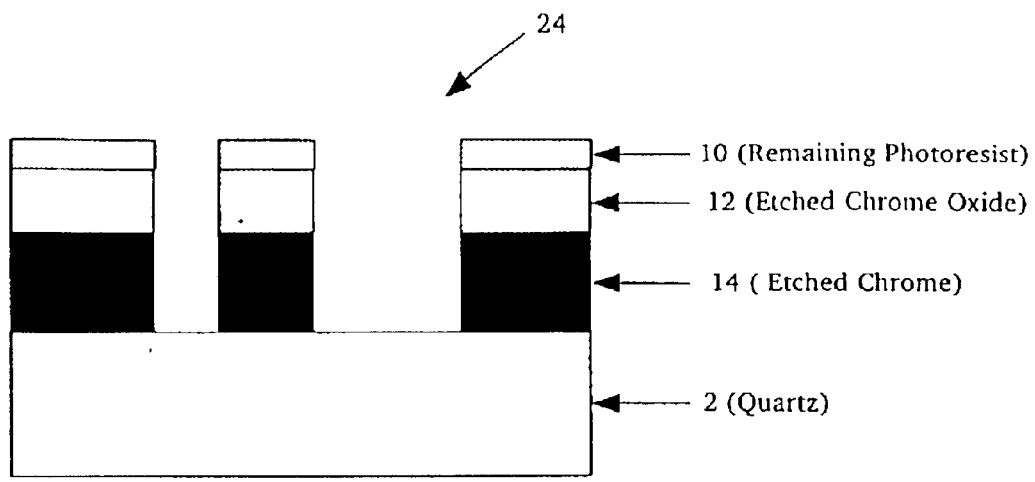
FIG. 3 is a cross-sectional view of a prior art binary photomask after being subjected to an etching process thereby removing the exposed CrO AR material and Cr opaque material.
Figure 4:
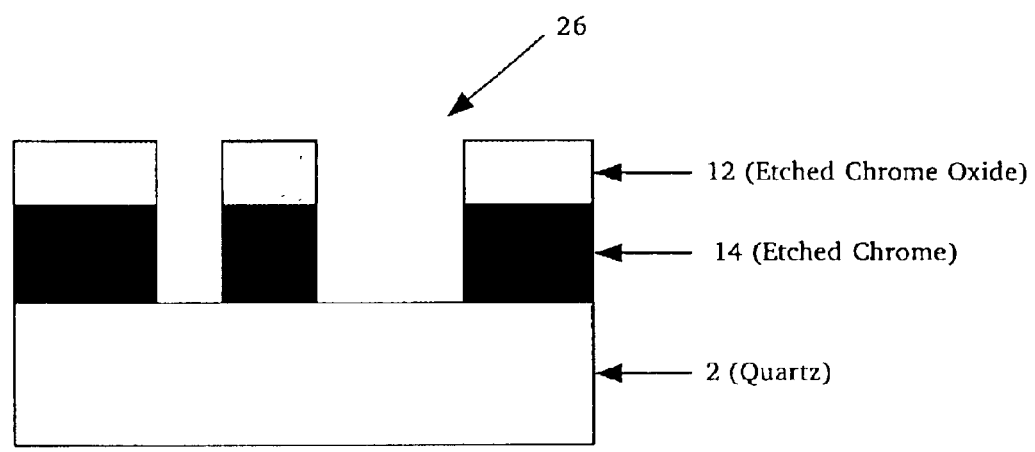
FIG. 4 is a cross-sectional view of a finished, prior art binary photomask with the photosensitive material stripped away.

Although the photomask 38 of FIG. 9 appears substantially identical to the prior art photomask shown in FIG. 4, those skilled in the art will appreciate that the critical dimensions of photomask 38 made in accordance with the instant invention will have improved uniformity in critical dimensions.

Although the instant invention has been described with respect to the particular embodiment of typical binary masks being comprised of Cr and CrO materials, those skilled in the art will appreciate that the instant invention can be used with photomask of different types including Phase Shift masks (PSM) and Next Generation Lithography (NGL) masks where the invented hard mask approach will benefit the manufacturability of these masks.

Additionally, depending on the composition of the opaque material, anti-reflective material, and hard mask material, different plasma gases may be used in the first and second etching processes. For example, chlorine may be used to etch a Si hard mask. A high oxygen concentration mixture of oxygen and chlorine may be used to perform the second etching for Cr. If $SiO_2$ is used as the hard mask, fluorinated species may be used to etch the hard mask.

Accordingly, the spirit and scope of the instant invention is to be construed broadly and limited only be the appended claims, and not by the foregoing specification.

What is claimed is:

1. A method for creating an image on a blank photomask comprising a photosensitive resist material layer, a hard mask layer underlying said photosensitive resist material layer, said hard mask layer made from materials which are selectively resistant to etching in said blank photomask, an opaque layer underlying said hard mask layer, and a substantially transparent substrate layer underlying said opaque layer, said method for creating an image comprising the steps of:

creating a patterned image in said photosensitive resist layer;

removing portions of said photosensitive resist layer that do not correspond to said patterned image thereby exposing portions of said hard mask layer not corresponding to said patterned image;

removing said exposed portions of said hard mask layer that do not correspond to said patterned image thereby exposing portions of said opaque layer not corresponding to said patterned image;

removing said exposed portions of said opaque layer underlying said hard mask layer portions that do not correspond to said patterned image thereby exposing portions of said substantially transparent layer that do not correspond to said patterned image; and removing said photosensitive resist layer.

2. The method of claim 1, wherein said hard mask layer is comprised of Si and said step of removing said exposed portions of said hard mask layer is conducted using plasma gases, the composition of which has either fluorine, chlorine, or bromine containing species or a combination of various halide containing species.

3. The method of claim 1, wherein said step of removing said exposed portions of said hard mask layer is conducted using plasma gases selected from the group consisting of $C_2F_6$, $CHF_3$, HBr, $Cl_2$, and $SF_6$.

4. The method of claim 1, wherein said hard mask layer is selected from the group consisting of Ti, TiW, W, $Si_3N_4$, $SiO_2$, TIN, and spin-on-glass and said step of removing said exposed portions of said hard mask layer is conducted using plasma gases, the composition of which has either fluorine, chlorine, or bromine containing species or a combination of various halide containing species.

5. The method of claim 4, wherein said step of removing said exposed portions of said hard mask layer is conducted using plasma gases selected from the group consisting of $C_2F_6$, $CHF_3$, HBr, $Cl_2$, and $SF_6$.

6. A method for creating an image on a photomask comprising a photosensitive resist material layer, a hard mask layer underlying said photosensitive resist material layer, said hard mask layer made from materials which are selectively resistant to etching in said photomask, an anti-reflective layer underlying said hard mask layer, an opaque layer underlying said anti-reflective layer, and a substantially transparent substrate layer underlying said opaque layer, said method for creating an image comprising the steps of:

creating a patterned image in said photosensitive resist layer;

removing portions of said photosensitive resist layer that do not correspond to said patterned image thereby exposing portions of said hard mask layer not corresponding to said patterned image;

removing said exposed portions of said hard mask layer that do not correspond to said patterned image thereby exposing portions of said anti-reflective layer overlying portions of said opaque layer not corresponding to said patterned image;

removing said exposed portions of said opaque layer underlying said anti-reflective portions that do not correspond to said patterned image thereby exposing portions of said substantially transparent layer that do not correspond to said patterned image; and removing said photosensitive resist layer.

7. The method of claim 6, wherein said hard mask layer is comprised of Si and said step of removing said exposed portions of said hard mask layer is conducted using plasma gases, the composition of which has either fluorine, chlorine, or bromine containing species or a combination of various halide containing species.

8. The method of claim 6, wherein said step of removing said exposed portions of said hard mask layer is conducted using plasma gases selected from the group consisting of $C_2F_6$, $CHF_3$, HBr, $Cl_2$, and $SF_6$.

9. The method of claim 6, wherein said hard mask layer is selected from the group consisting of Ti, TiW, W, $Si_3N_4$, $SiO_2$, TiN, and spin-on-glass and said step of removing said exposed portions of said hard mask layer is conducted using plasma gases, the composition of which has either fluorine, chlorine, or bromine containing species or a combination of various halide containing species.

10. The method of claim 9, wherein said step of removing said exposed portions of said hard mask layer is conducted using plasma gases selected from the group consisting of $C_2F_6$, $CHF_3$, HBr, $Cl_2$, and $SF_6$.

11. The method of claim 6, further comprising removing said exposed portions of said anti-reflective layer and said portions of said opaque layer that do not correspond to said patterned image by using plasma gases comprised of $Cl_2$ and $O_2$ thereby exposing portions of said substantially transparent substrate layer not corresponding to said patterned image, wherein said opaque layer is comprised of Cr and said anti-reflective layer is comprised of CrO.

* * * * *